(12) United States Patent
Cho et al.

(10) Patent No.: US 10,157,873 B1
(45) Date of Patent: Dec. 18, 2018

(54) SEMICONDUCTOR PACKAGE INCLUDING BUMP

(71) Applicant: SK hynix Inc., Icheon-si, Gyeonggi-do (KR)

(72) Inventors: Jun-Hyun Cho, Namyangju-si (KR); Young-Suk Ryu, Seoul (KR); Jae-Yong An, Hwaseong-si (KR); Il-Hwan Cho, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/703,297

(22) Filed: Sep. 13, 2017

(30) Foreign Application Priority Data

Jun. 14, 2017 (KR) .......................... 10-2017-0074730

(51) Int. Cl.
*H01L 23/48* (2006.01)
*H01L 23/488* (2006.01)
(Continued)

(52) U.S. Cl.
CPC .............. *H01L 24/13* (2013.01); *H01L 24/05* (2013.01); *H01L 24/11* (2013.01); *H01L 2224/0401* (2013.01); *H01L 2224/05124* (2013.01); *H01L 2224/05582* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05669* (2013.01); *H01L 2224/05684* (2013.01); *H01L 2224/11462* (2013.01); *H01L 2224/11849* (2013.01);
(Continued)

(58) Field of Classification Search
CPC ......... H01L 24/05; H01L 24/03; H01L 24/81; H01L 24/11; H01L 2224/0401; H01L 2224/1701; H01L 2224/81815; H01L 2224/13144; H01L 24/13; H01L 2924/3511; H01L 2224/1362; H01L 2224/13639; H01L 2224/13611; H01L 2224/13155; H01L 2224/13147; H01L 2924/00014; H01L 2224/05669; H01L 2224/05666; H01L 2224/05582; H01L 2224/05124
See application file for complete search history.

(56) References Cited

U.S. PATENT DOCUMENTS 8,710,657 B2     4/2014   Park et al.
2010/0297842 A1*  11/2010  Ke .......................... H01L 24/11
                                                          438/614
(Continued)

FOREIGN PATENT DOCUMENTS

KR    1020120035721 A    4/2012
KR    1020130035619 A    4/2013

*Primary Examiner* — Jasmine Clark
(74) *Attorney, Agent, or Firm* — William Park & Associates Ltd.

(57) ABSTRACT

A semiconductor device includes a semiconductor chip having a pad which is exposed through a passivation layer, a bump pillar formed over the passivation layer adjacent to the pad, but not overlapping with the pad. The semiconductor chip also has a solder layer including a solder bump portion which is formed over the bump pillar and a solder fillet portion which is formed at one side of the bump pillar facing the pad to cover the pad and electrically couples the bump pillar and the pad.

23 Claims, 11 Drawing Sheets

(51) Int. Cl.
*H01L 23/528* (2006.01)
*H01L 23/00* (2006.01)
(52) U.S. Cl.
CPC ............ *H01L 2224/13013* (2013.01); *H01L 2224/13027* (2013.01); *H01L 2224/1357* (2013.01); *H01L 2224/1362* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/13566* (2013.01); *H01L 2224/13611* (2013.01); *H01L 2224/13613* (2013.01); *H01L 2224/13639* (2013.01); *H01L 2224/13647* (2013.01); *H01L 2224/13664* (2013.01); *H01L 2924/014* (2013.01); *H01L 2924/3511* (2013.01)

(56) References Cited

U.S. PATENT DOCUMENTS

| | | |
|---|---|---|
| 2013/0082090 A1 | 4/2013 | Cho et al. |
| 2013/0292827 A1* | 11/2013 | Kuo .................. H01L 23/49816 257/737 |
| 2014/0117535 A1* | 5/2014 | Daubenspeck ..... H01L 23/3114 257/737 |
| 2016/0099223 A1* | 4/2016 | Hsieh ...................... H01L 24/13 257/737 |

* cited by examiner

SEMICONDUCTOR PACKAGE INCLUDING BUMP

CROSS-REFERENCE TO RELATED APPLICATION

The present application claims priority to Korean Patent Application No. 10-2017-0074730 filed in the Korean Intellectual Property Office on Jun. 14, 2017, which is incorporated herein by reference in its entirety.

BACKGROUND

1. Technical Field

Various embodiments generally relate to a semiconductor technology, and more particularly, to a semiconductor device which includes a bump.

2. Related Art

A semiconductor package is manufactured by mounting a semiconductor chip to a substrate. In a wire bonding method, a semiconductor chip and a substrate are coupled by wires. However, miniaturization of semiconductor devices, increase signal processing speed and increases the number of input/output signals, have led to the use of a flip chip bonding method using bumps instead of the wire bonding method using wires.

In the flip chip bonding method, bumps are formed on pads of a semiconductor chip, and the semiconductor chip is electrically and mechanically coupled with a substrate through the bumps. In the flip chip bonding method, because signal transfer between the semiconductor chip and the substrate is implemented by the bumps, a signal transfer length is shortened, whereby advantages are provided in terms of high speed operation and miniaturization.

SUMMARY

In an embodiment, a semiconductor device may include: a semiconductor chip having a pad which is exposed through a passivation layer; a bump pillar formed over the passivation layer adjacent to the pad, but not overlapping with the pad; and a solder layer including a solder bump portion which is formed over the bump pillar and a solder fillet portion which is formed at one side of the bump pillar facing the pad to cover the pad and electrically couples the bump pillar and the pad.

In an embodiment, a semiconductor device may include: a semiconductor chip having a plurality of pads which are disposed in line along a second direction perpendicular to a first direction and a passivation layer which leaves the pads exposed; a plurality of bump pillars formed over the passivation layer, corresponding to the pads, respectively, and disposed to be separated from corresponding pads, respectively, in the first direction; and a plurality of solder layers formed over corresponding pads and corresponding bump pillars, respectively. Each of the solder layers includes a solder bump portion which is formed over a corresponding bump pillar and a solder fillet portion which is formed at one side of the bump pillar facing a corresponding pad to cover the pad and electrically couples the bump pillar and the pad.

In an embodiment, a method for manufacturing a semiconductor device may include: preparing a semiconductor chip having a pad which is exposed through a passivation layer; forming a bump pillar over the passivation layer adjacent to the pad to not overlap with the pad; forming a solder layer over the bump pillar and the pad; and reflowing the solder layer, thereby forming a solder bump portion over the bump pillar and forming a solder fillet portion at one side of the bump pillar facing the pad to cover the pad and electrically couple the bump pillar and the pad.

DETAILED DESCRIPTION

Hereinafter, a semiconductor package having a bump will be described below with reference to the accompanying drawings through various example embodiments.

Figure 1:
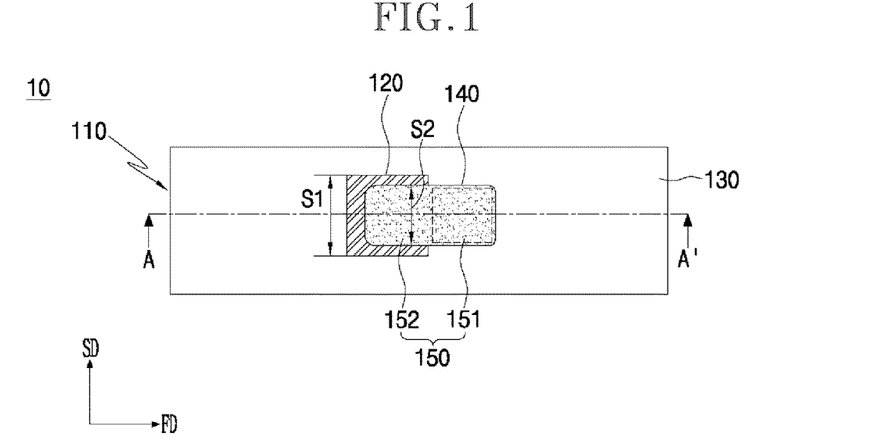
FIG. 1 is a top view illustrating a representation of an example part of a semiconductor device in accordance with an embodiment.
Figure 2:
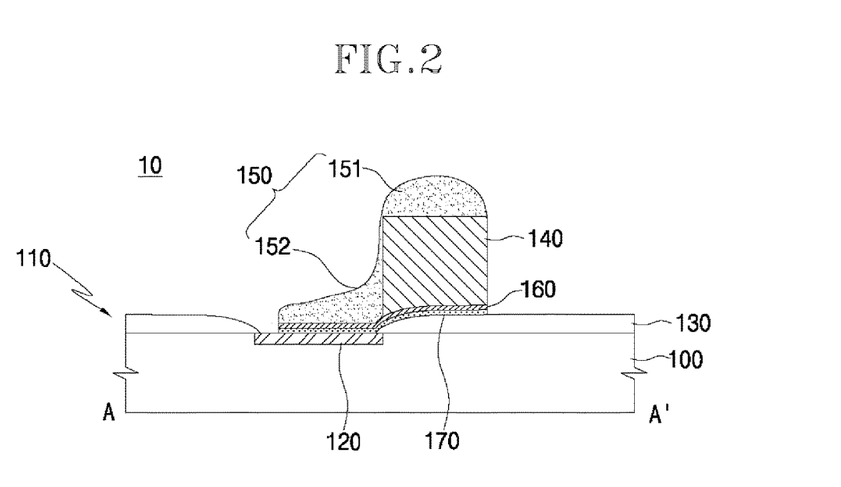
FIG. 2 is a cross-sectional view taken along the line A-A' of FIG. 1.

FIG. 1 is a top view illustrating a representation of an example part of a semiconductor device 10 in accordance with an embodiment, and FIG. 2 is a cross-sectional view taken along a line A-A' of FIG. 1.

Referring to FIGS. 1 and 2, a semiconductor chip 110 having a pad 120 which is exposed through a passivation layer 130 may be provided.

The semiconductor chip 110 may include a semiconductor substrate 100 which is defined with the pad 120 on one surface thereof. The semiconductor substrate 100 may be provided with a circuit unit (not shown) in which individual elements necessary for operation of the semiconductor chip 110, such as transistors, resistors, capacitors, and fuses, are electrically coupled with one another. The pad 120 as an external contact of the circuit unit for electrical coupling with an external electronic device may be electrically coupled with the circuit unit. The pad 120 may be made of a metal such as aluminum (Al) or an aluminum alloy.

While not shown, a portion of the circuit unit may be disposed to overlap with the pad 120. The circuit unit may include a power decoupling capacitor, a clamp circuit, an electrostatic discharge (ESD) protection circuit, and so forth. The power decoupling capacitor may be coupled between a power supply voltage pad and a ground voltage pad to reduce power noise when a power supply voltage (VCC) necessary for operation of the semiconductor chip 110 is supplied. Such a power decoupling capacitor may suppress an abrupt change in the power supply voltage, and thereby prevent malfunction of the semiconductor chip 110. The clamp circuit and the ESD protection circuit may play the role of protecting circuits inside the semiconductor chip 110 from a high voltage in the case where the high voltage is immediately introduced into the semiconductor chip 110 due to an electrostatic discharge phenomenon. The clamp circuit and the ESD protection circuit may be coupled to each pad through which external signals are received. The ESD protection circuit may receive a low voltage below a ground voltage (VSS) or a high voltage above the power supply voltage through a pad, and discharge the received voltage to a ground voltage line or a power supply voltage line through the clamp circuit. The power decoupling capacitor, the clamp circuit, and the ESD protection circuit may be disposed to overlap with the pad 120.

Because the circuit unit is disposed to overlap with the pad 120, the size of the semiconductor chip 110 may be reduced by utilizing the area of the semiconductor chip 110 to the maximum. However, if the circuit unit is disposed under the pad 120, the pad 120 and its underlying structure may become substantially invulnerable to a stress, and thus, a defect may occur in that the pad 120 is likely to be lifted when stress is applied. Embodiments of the present disclosure may provide a technology capable of reducing the stress applied to the pad 120 and thereby suppressing the lifting of the pad 120.

The semiconductor substrate 100 may have an active surface and an inactive surface which faces away from the active surface. A surface on which the pad 120 is positioned may be the active surface of the semiconductor substrate 100. The active surface of the semiconductor substrate 100 may be covered by the passivation layer 130 having an opening which leaves the pad 120 exposed.

The passivation layer 130 may play the role of protecting the active surface of the semiconductor substrate 100. Also, the passivation layer 130 may play the role of buffering the stress transferred from an exterior. The passivation layer 130 may be an insulating resin, for example, a polyimide-based material such as a photosensitive polyimide.

A bump pillar 140 may be formed over the passivation layer 130 adjacent to the pad 120. The bump pillar 140 may be disposed adjacent to the pad 120 in a first direction FD. The bump pillar 140 overlaps with the passivation layer 130, and is separated from the pad 120 in the first direction FD by a predetermined spacing so that the bump pillar 140 does not overlap with the pad 120. The bump pillar 140 may have a quadrangular prism shape. The width of the bump pillar 140 in a second direction SD may be narrower than the width of the pad 120 in the second direction SD. In the present embodiment, as shown in the drawing, the first direction FD and the second direction SD indicate directions that are perpendicular to each other.

A solder layer 150 may be formed over the pad 120 and on the bump pillar 140. The solder layer 150 may include a solder bump portion 151 and a solder fillet portion 152.

The solder bump portion 151 may be disposed on the top surface of the bump pillar 140, and may be hemispherical or a portion of a sphere having a predetermined curvature in cross-section. The solder fillet portion 152 may be formed on one side of the bump pillar 140 facing the pad 120 to cover the top surface of the pad 120, and electrically couple the bump pillar 140 and the pad 120.

The solder fillet portion 152 may be formed to not cover the entirety of the top surface of the pad 120, but only a portion of the top surface of the pad 120. The solder fillet portion 152 may be formed to cover a portion of the top surface of the pad 120 which is adjacent to the bump pillar 140 and to leave the remainder of the top surface of the pad 120 exposed except for the portion that is covered by the solder fillet portion 152. The solder fillet portion 152 may be formed to cover one edge portion of the pad 120 which is adjacent to the bump pillar 140 and the center portion of the pad 120, and the solder fillet portion 152 does not cover the remaining edge portions of the pad 120 which define the shape of a clockwise 90-degree rotated U. The width of the solder fillet portion 152 in the second direction SD may be narrower than the width of the pad 120 in the second direction SD. In the case where the width of the pad 120 in the second direction SD is S1 and the width of the solder fillet portion 152 in the second direction SD is S2, S2 may be less than S1.

A seed layer 160 may be interposed between the bump pillar 140 and the passivation layer 130, and between the solder fillet portion 152 and the pad 120.

In the same manner as the solder fillet portion 152, the seed layer 160 may be formed to not cover the entirety but only a portion of the top surface of the pad 120. The seed layer 160 may cover a portion of the pad 120 which is adjacent to the bump pillar 140, and not cover the remainder of the pad 120 except the portion which is adjacent to the bump pillar 140.

The seed layer 160 may be formed of the same material as the bump pillar 140. For example, the bump pillar 140 and the seed layer 160 may be formed of a material including at least any one among copper, nickel, gold, silver, platinum, and alloys thereof.

A barrier layer 170 may be further interposed between the seed layer 160 and the passivation layer 130, and between the seed layer 160 and the pad 120. The barrier layer 170 may be formed of titanium (Ti) or titanium tungsten (TiW). In the case where the barrier layer 170 is formed, it is possible to prevent a material forming the seed layer 160 from diffusing downward. The barrier layer 170 may play the role of an adhesive layer for allowing the seed layer 160 to adhere to the pad 120 and the passivation layer 130, which are underlying material layers.

The solder fillet portion 152 may be disposed on the seed layer 160 and not brought into direct contact with the pad 120, and may be electrically coupled to the pad 120 through the seed layer 160 and the barrier layer 170.

Figure 3:
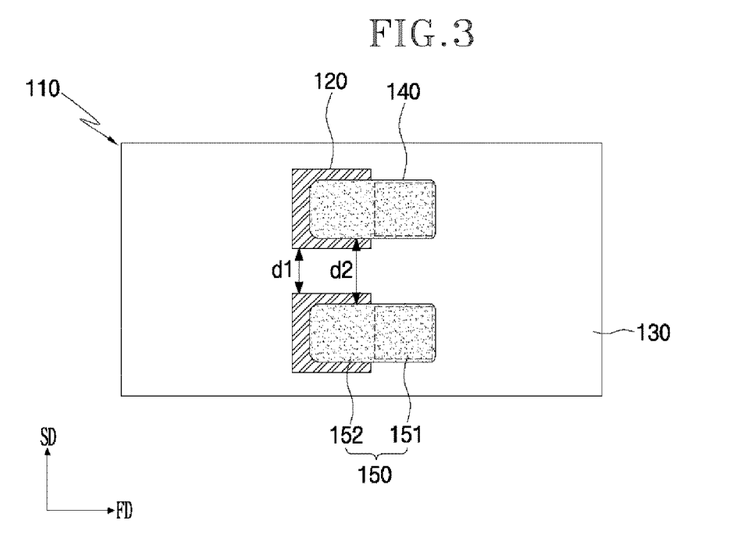
FIG. 3 is a top view illustrating a representation of an example part of a semiconductor device in accordance with an embodiment.

Referring to FIG. 3, in an embodiment, a semiconductor chip 110 may include a plurality of pads 120 which are exposed through a passivation layer 130. The plurality of pads 120 may be disposed in line along a second direction SD that is defined in FIG. 3.

A plurality of bump pillars 140 respectively corresponding to the plurality of pads 120 may be disposed on the passivation layer 130. The same number of bump pillars 140 as pads 120 may be formed. The pads 120 and the bump pillars 140 corresponding to each other may be disposed adjacent to each other in a first direction FD. The bump pillars 140 may be disposed along the second direction SD to have the same pitch as the pitch of the pads 120 in the second direction SD.

The width of each of the bump pillars 140 in the second direction SD may be less than the width of each of the pads 120 in the second direction SD. In the case where the bump pillars 140 are disposed along the second direction SD to have the same pitch as the pitch of the pads 120, and the width of each of the bump pillars 140 in the second direction SD is less than the width of each of the pads 120 in the second direction SD, the spacing of adjacent bump pillars 140 in the second direction SD may be greater than the spacing of adjacent pads 120 in the second direction SD.

A plurality of solder layers 150 which respectively couple the pads 120 and the bump pillars 140 corresponding to each other may be formed over the pads 120 and on the bump pillars 140. The same number of solder layers 150 as pads 120 may be formed. Each of the solder layers 150 may have a line shape which extends in the first direction FD when viewed in the plane so as to successively cover a corresponding pad 120 and a corresponding bump pillar 140. In other words, each solder layer 150 may have a linear type planar structure which extends in the first direction FD to continuously cover the corresponding pad 120 and the corresponding bump pillar 140. The pitch of the solder layers 150 in the second direction SD may be the same as the pitch of the pads 120 in the second direction SD.

Each of the solder layers 150 may include a solder bump portion 151 which is formed on the bump pillar 140 and a solder fillet portion 152 which is formed on the side of the bump pillar 140 facing the pad 120 to cover the pad 120.

The width of each of the solder bump portions 151 in the second direction SD may be substantially the same as the width of each of the bump pillars 140 in the second direction SD. In the case where the width of each of the bump pillars 140 in the second direction SD is less than the width of each of the pads 120 in the second direction SD, the width of each of the solder bump portions 151 in the second direction SD may be less than the width of each of the pads 120 in the second direction SD.

The width of each of the solder fillet portions 152 in the second direction SD may be substantially the same as the width of each of the bump pillars 140 in the second direction SD. In the case where the width of each of the bump pillars 140 in the second direction SD is less than the width of each of the pads 120 in the second direction SD, the width of each of the solder fillet portions 152 in the second direction SD may be less than the width of each of the pads 120 in the second direction SD.

In the case where the pitch of the solder layers 150 in the second direction SD is the same as the pitch of the pads 120 in the second direction SD and the width of each of the solder layers 150 including the solder fillet portions 152 in the second direction SD is less than the width of each of the pads 120 in the second direction SD, the spacing of the solder fillet portions 152 included in adjacent solder layers 150 in the second direction SD may be wider than the spacing of adjacent pads 120 in the second direction SD. In the case where the spacing between adjacent pads 120 in the second direction SD is d1 and the spacing between adjacent solder fillet portions 152 in the second direction SD is d2, d2 may be greater than d1. In this way, by setting the spacing d2 between adjacent solder fillet portions 152 to be wider than the spacing d1 between adjacent pads 120, it is possible to suppress adjacent solder fillet portions 152 from being coupled and thereby shorted with each other.

Hereafter, a method for manufacturing a semiconductor device in accordance with an embodiment will be described.

Figure 4:
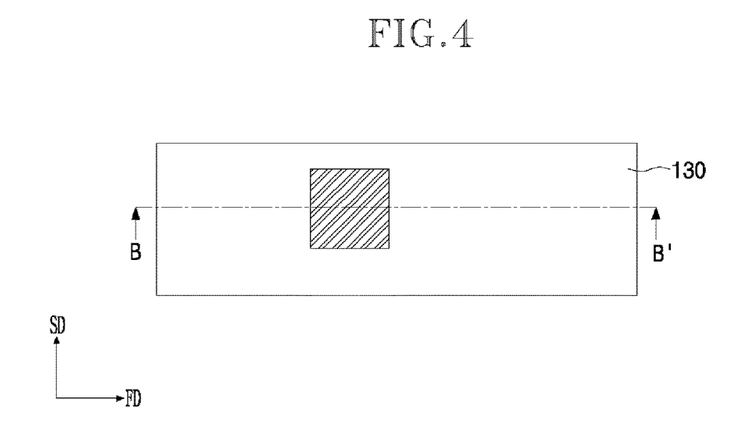
FIGS. 4 to 16 are representations of examples of views to assist in the stepwise explanation of a method for manufacturing a semiconductor device in accordance with an embodiment.
Figure 5:
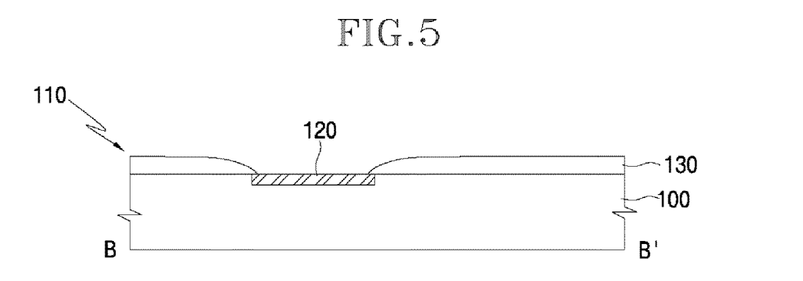

FIG. 4 is a representation of an example of a top view to assist in an explanation of a step of preparing a semiconductor chip 110 in accordance with an embodiment, and FIG. 5 is a cross-sectional view taken along the line B-B' of FIG. 4.

Referring to FIGS. 4 and 5, a semiconductor chip 110 having a pad 120 which is exposed through a passivation layer 130 may be prepared.

The semiconductor chip 110 may include a semiconductor substrate 100 which has the pad 120 on one surface thereof. The semiconductor substrate 100 may be provided with a circuit unit (not shown) in which individual elements necessary for operation of the semiconductor chip 110, such as transistors, resistors, capacitors and fuses, are electrically coupled with one another. The pad 120 as an external contact of the circuit unit for electrical coupling with an external electronic device may be electrically coupled with the circuit unit.

The pad 120 may be made of a metal such as aluminum or an aluminum alloy. The pad 120 may be formed by depositing a metal such as aluminum or an aluminum alloy through sputtering or thermal evaporation and then performing photolithography and etching processes using a mask.

The semiconductor substrate 100 may have an active surface and an inactive surface which faces away from the active surface. A surface on which the pad 120 is positioned may be the active surface of the semiconductor substrate 100.

The passivation layer 130 which has an opening exposing the pad 120 may be formed on the active surface of the semiconductor substrate 100. While not shown, after the semiconductor chip 110 of the above-described structure is formed, the semiconductor chip 110 may be electrically tested. In a test process, a probe tip of test equipment may be brought into contact with the pad 120 of the semiconductor chip 110. The test equipment may apply a predetermined voltage or current to the pad 120 through the probe tip to detect a defect of the semiconductor chip 110. The contact with the probe tip may cause a probe mark on the surface of the pad 120. The probe mark indicates that the surface layer of the pad 120 is pushed or distorted by the probe tip to cause a dent and/or an overhang.

Figure 6:
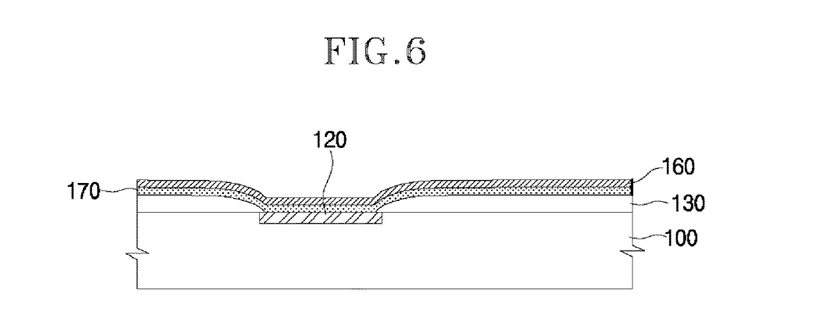

FIG. 6 is a cross-sectional view illustrating step of forming a barrier layer 170 and a seed layer 160 in accordance with an embodiment.

Referring to FIG. 6, the barrier layer 170 is formed on the pad 120 and the passivation layer 130 of the semiconductor chip 110, and the seed layer 160 is formed on the barrier layer 170. In one example, the barrier layer 170 may be formed over the passivation layer 130 and the pad 120 before forming the seed layer 160. Further, the seed layer 160 may be formed over the passivation layer 170 and the pad 120 before forming the bump pillar 140. In an embodiment, formation of the barrier layer 170 may be omitted.

The barrier layer 170 may be formed of, for example, titanium (Ti) or titanium tungsten (TiW). The seed layer 160 may be formed of, for example, a material including at least any one among copper, nickel, gold, silver, platinum, and alloys thereof.

Figure 7:
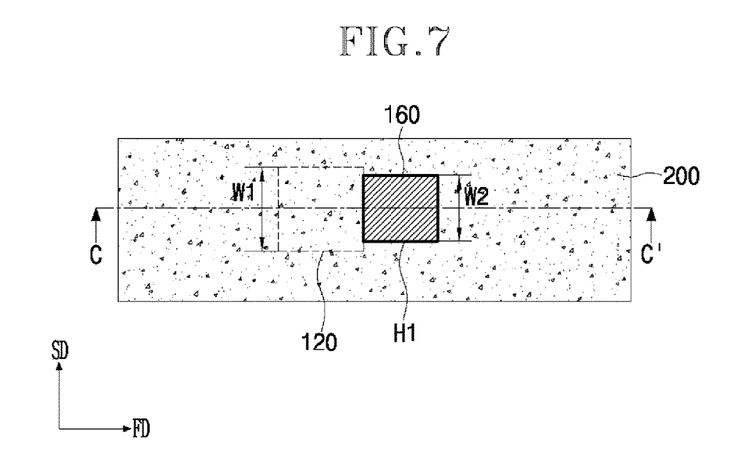
Figure 8:
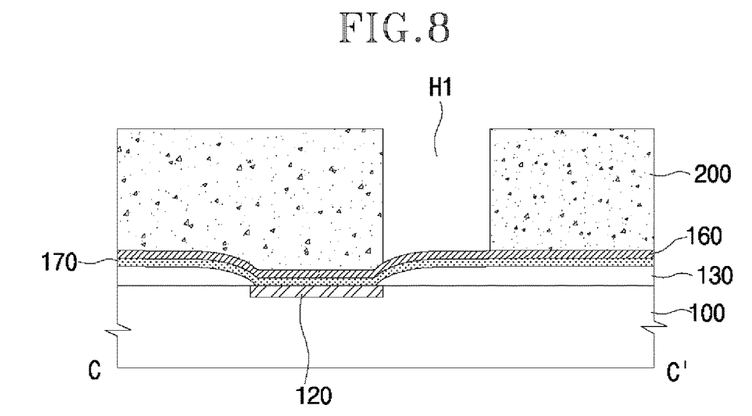

FIG. 7 is a representation of an example of a top view to assist in the explanation of a step of forming a first mask pattern 200 in accordance with an embodiment, and FIG. 8 is a cross-sectional view taken along the line C-C' of FIG. 7.

Referring to FIGS. 7 and 8, the first mask pattern 200 is formed on the seed layer 160. The first mask pattern 200 covers the seed layer 160 over the pad 120, and has a first opening H1 which leaves exposed a portion of the seed layer 160 over the passivation layer 130 near the pad 120.

The first mask pattern 200 may be formed by forming a photoresist to a predetermined thickness over the pad 120 and the passivation layer 130, and then patterning the photoresist through exposure and development processes.

The first opening H1 may be formed adjacent to the pad 120 in a first direction FD. The first opening H1 may be formed to not overlap with the pad 120 and overlap with a portion of the passivation layer 130 adjacent to the pad 120. Due to this fact, the first opening H1 does not expose the seed layer 160 formed over the pad 120, and exposes the seed layer 160 formed over the passivation layer 130 adjacent to the pad 120.

As will be described below with reference to FIG. 9, a bump pillar (see the reference numeral 140 of FIG. 9) is formed in the first opening H1. The first opening H1 may have a planar shape corresponding to the shape of the bump pillar 140 to be formed. For example, in the case where the bump pillar 140 has a quadrangular prism shape, the first opening H1 may have a quadrangular planar shape such as a rectangle or a square. In the case where the bump pillar 140 has a cylindrical shape, the first opening H1 may have a circular planar shape.

Referring to FIGS. 7 and 8, the width of the first opening H1 in a second direction SD may be narrower than the width of the pad 120 in the second direction SD. For example, in the case where the width of the pad 120 in the second direction SD is W1 and the width of the first opening H1 in the second direction SD is W2, W2 may be less than W1.

In the case where there are a plurality of pads 120, a plurality of first openings H1 may be formed to correspond to the pads 120, respectively. The same number of first openings H1 as the number of the pads 120 may be formed.

After the first mask pattern 200 is formed, a descum process for removing a residue or scum of the photoresist may be performed.

Figure 9:
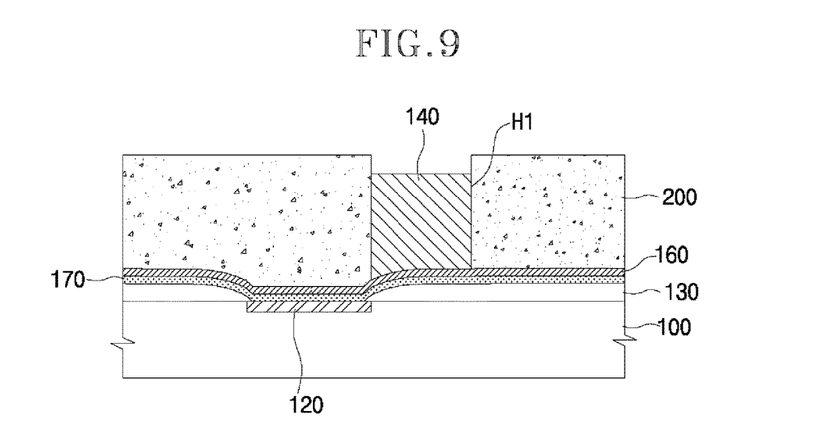

FIG. 9 is a cross-sectional view illustrating step of forming the bump pillar 140 in accordance with an embodiment.

Referring to FIG. 9, the bump pillar 140 is formed on the seed layer 160 in the first opening H1.

The bump pillar 140 may be formed using an electrolytic plating process. The bump pillar 140 may be formed of a material including at least any one among copper, nickel, gold, silver, platinum, and alloys thereof. The bump pillar 140 may be formed of the same material as the seed layer 160.

Because the first opening H1 does not overlap with the pad 120 and overlaps with the passivation layer 130 adjacent to the pad 120, the bump pillar 140 is also formed to not overlap with the pad 120 and overlap with the passivation layer 130 adjacent to the pad 120. Because the width of the first opening H1 in the second direction SD is narrower than the width of the pad 120 in the second direction SD, the width of the bump pillar 140 in the second direction SD is also narrower than the width of the pad 120 in the second direction SD.

Figure 10:
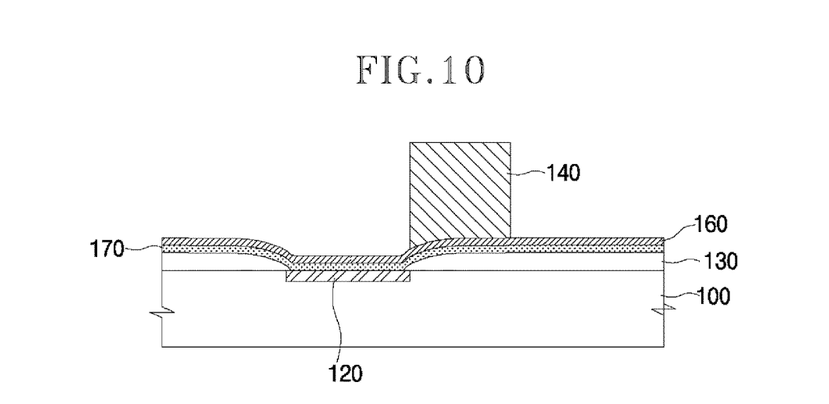

FIG. 10 is a cross-sectional view illustrating a step of removing the first mask pattern 200.

Referring to FIG. 10, the first mask pattern 200 illustrated in FIG. 9 is removed. In order to remove the first mask pattern 200, a stripping or ashing process may be performed. After removing the first mask pattern 200, a process of removing a native oxide layer formed on the surface of the seed layer 160 and the bump pillar 140 may be performed.

Figure 11:
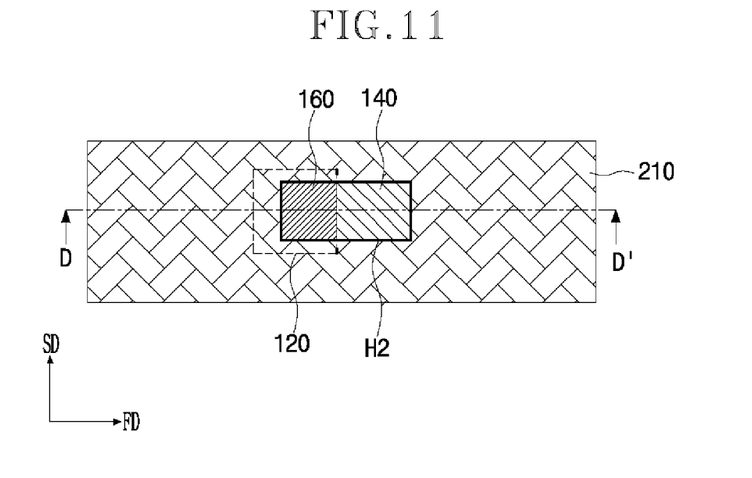
Figure 12:
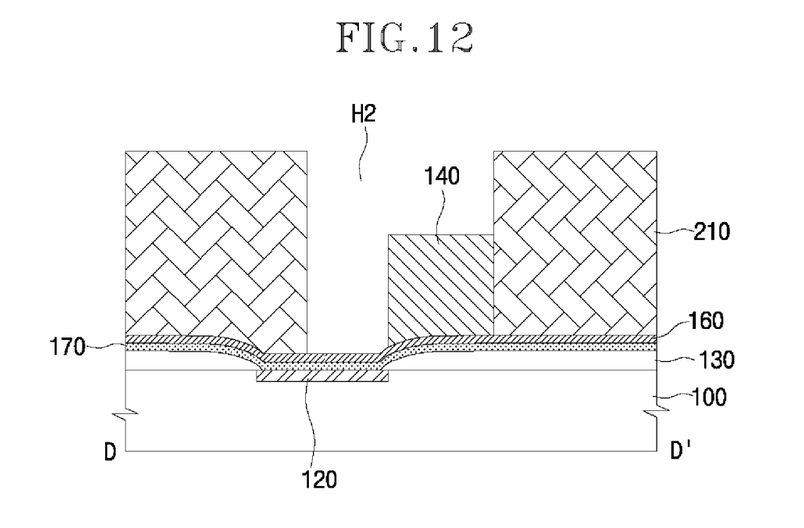
Figure 13:
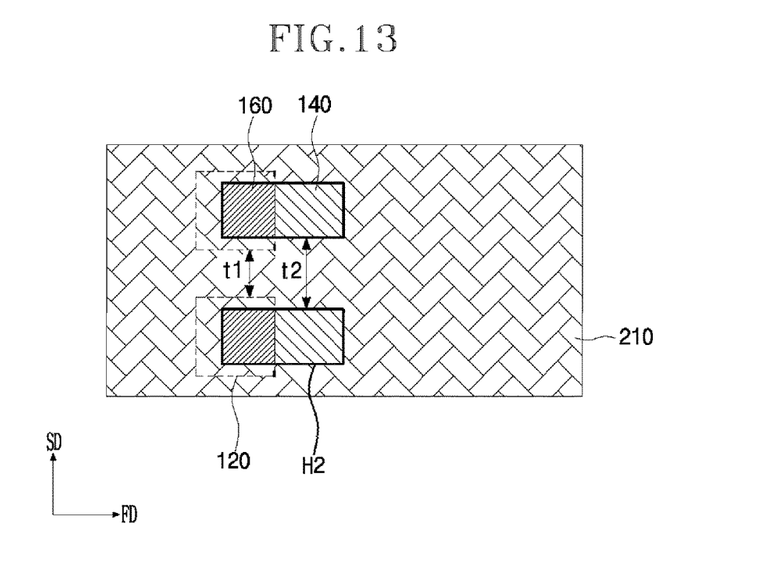

FIG. 11 is a top view illustrating a step of forming a second mask pattern 210 in accordance with an embodiment, FIG. 12 is a cross-sectional view taken along the line D-D' of FIG. 11, and FIG. 13 is a top view illustrating the second mask pattern 210 in the case where there are a plurality of pads 120.

Referring to FIGS. 11 and 12, the second mask pattern 210 having a second opening H2 is formed on the seed layer 160. The second mask pattern 210 may be formed by forming a photoresist to a predetermined thickness on the seed layer 160 and the bump pillar 140, and patterning the photoresist by exposure and development processes.

The second opening H2 may leave exposed the seed layer 160 over the pad 120, the top surface of the bump pillar 140, and one side surface of the bump pillar 140 which is adjacent to the pad 120. Adjacent to in this case may mean that if one side of the bump pillar 140 were extended downward that side of the bump pillar 140 may be contiguous with the pad 120.

The second opening H2 may be formed to not expose the entirety but only a portion of the seed layer 160 which is positioned over the pad 120. The second opening H2 may be formed to expose the seed layer 160 which is formed over a portion of the pad 120 adjacent to the bump pillar 140 and not expose the seed layer 160 which is formed over the remainder of the pad 120 except the portion adjacent to the bump pillar 140.

The second opening H2 may be formed to expose the seed layer 160 which is formed over one edge portion of the pad 120 adjacent to the bump pillar 140 and the center portion of the pad 120, and not expose the seed layer 160 which is formed over remaining edge portions of the pad 120 defining the shape of a clockwise 90-degree rotated U. The width of the second opening H2 in the second direction SD may be narrower than the width of the pad 120 in the second direction SD. When viewed in the second direction SD, the second opening H2 may be formed to expose the seed layer 160 which is formed over the center portion of the pad 120 and not expose the seed layer 160 which is formed over both ends of the pad 120. Referring to FIG. 13, in the case where there are a plurality of pads 120, a plurality of second openings H2 may be formed to correspond to the pads 120, respectively. The same number of second openings H2 may be formed as the number of the pads 120.

The spacing between adjacent second openings H2 in the second direction SD may be wider than the spacing between adjacent pads 120 in the second direction SD. For example, in the case where the spacing between adjacent pads 120 in the second direction SD is t1 and the spacing between adjacent second openings H2 in the second direction SD is t2, t2 may be greater than t1.

After the second mask pattern 210 is formed, a descum process for removing a residue or scum of the photoresist may be performed.

Figure 14:
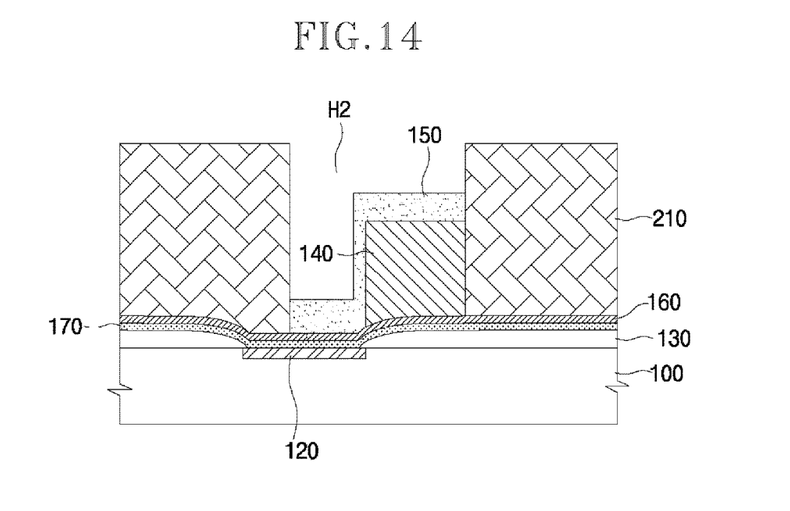

FIG. 14 is a cross-sectional view illustrating step of forming a solder layer 150 in accordance with the embodiment.

Referring to FIG. 14, the solder layer 150 is formed on the bump pillar 140 and the seed layer 160 which are exposed through the second mask pattern 210. The solder layer 150 may be formed on the top surface of the bump pillar 140, the one side surface of the bump pillar 140 adjacent to the pad 120, and the seed layer 160 which is formed over the portion of the pad 120 adjacent to the bump pillar 140.

The solder layer 150 may be formed using an electrolytic plating process. The plating process may be performed such that the solder layer 150 is formed over the bump pillar 140 and the seed layer 160 both of which the second opening H2 exposes. The solder layer 150 may be an alloy of tin (Sn) and silver (Ag), and copper (Cu), palladium (Pd), bismuth (Bi), antimony (Sb), or the like may be added as needed.

Figure 15:
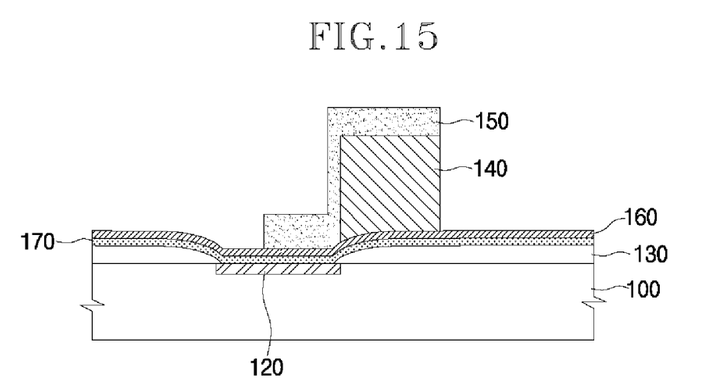

FIG. 15 is a cross-sectional view illustrating a step of removing the second mask pattern 210 in accordance with an embodiment.

Referring to FIG. 15, the second mask pattern 210 illustrated in FIG. 14 is removed. In order to remove the second mask pattern 210, a stripping or ashing process may be performed.

Figure 16:
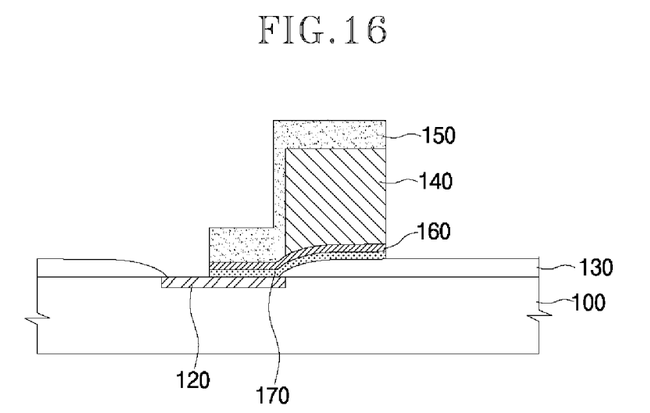

FIG. 16 is a cross-sectional view illustrating a step of partially removing the seed layer 160 and the barrier layer 170 in accordance with an embodiment.

Referring to FIG. 16, after the seed layer 160 excluding a region of the seed layer 160 lying under the solder layer 150 is removed, and the barrier layer 170 is removed from a region excluding a region lying under the solder layer 150 by using the solder layer 150 as an etch mask. In other words, after the solder layer 150 is formed and before reflowing the solder layer 150, the seed layer 160 may be removed using the solder layer 150 as a mask. A process for removing the seed layer 160 and the barrier layer 170 may be performed using a wet etching process.

After the seed layer 160 and the barrier layer 170 of the region except the region lying under the solder layer 150 are removed, a reflow process is performed, and thereby, a solder bump portion 151 and a solder fillet portion 152 are formed as illustrated in FIG. 2.

The reflow process may be performed at a temperature equal to or higher than the melting point of the solder layer 150, for example, a temperature equal to or higher than 260° C. By the reflow process, the solder layer 150 may be melted into a liquid state.

During the reflow process, most of the solder layer 150 on the top surface of the bump pillar 140 may form a portion of a sphere or a hemisphere which has a predetermined curvature, on the top surface of the bump pillar 140, due to surface tension in the molten liquid state, and may then be cooled to form the solder bump portion 151 (see FIG. 2). A portion of solder on the top surface of the bump pillar 140 may flow downward along one side surface of the bump pillar 140 due to its own weight to form a fillet shape which covers the one side surface of the bump pillar 140 and the seed layer 160 over the pad 120, in cooperation with the solders formed on one side surface of the bump pillar 140 and the seed layer 160 over the pad 120, and may then be cooled to form the solder fillet portion 152 (see FIG. 2).

Referring again to FIG. 2, the solder fillet portion 152 may be brought into direct contact with the bump pillar 140, and may be electrically coupled to the bump pillar 140. The solder fillet portion 152 may be brought into contact with the seed layer 160 over the pad 120, and may be electrically coupled with the pad 120 through the seed layer 160 and the barrier layer 170.

Figure 17A:
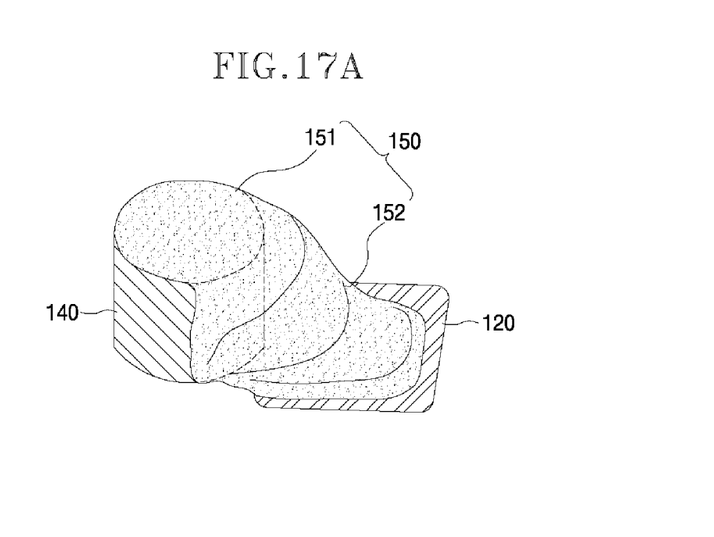
FIGS. 17A and 17B are perspective views illustrating profiles of solder layers according to shapes of bump pillars in accordance with embodiments.
Figure 17B:
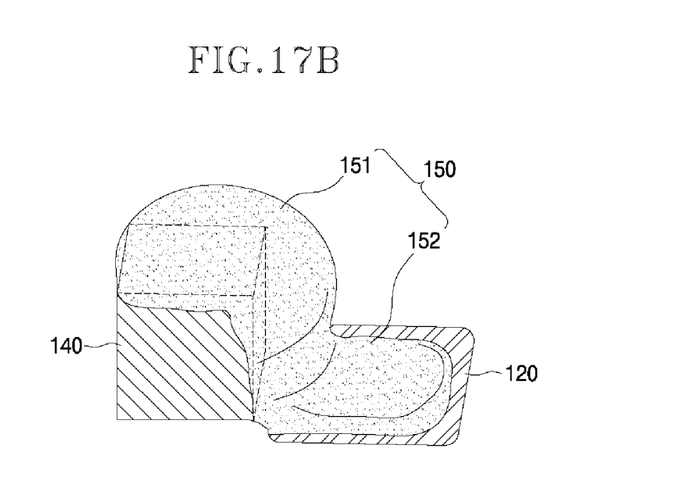

FIGS. 17A and 17B are perspective views illustrating profiles of solder bump portions according to the shapes of bump pillars in accordance with embodiments. FIG. 17A illustrates a case where a bump pillar has a cylindrical shape, and FIG. 17B illustrates a case where a bump pillar has a quadrangular prism shape.

Referring to FIG. 17A, in the case where a bump pillar 140 is formed into a cylindrical shape, a large amount of solder may flow downward from the top of the bump pillar 140 toward the bottom of the bump pillar 140 in a solder reflow process, and thus, an amount of solder remaining on the bump pillar 140 after the reflow process may be small. Therefore, the height of a solder bump portion 151 becomes low.

The solder bump portion 151 plays the role of bonding the bump pillar 140 and a substrate in the case of mounting a semiconductor device to the substrate. If the height of the solder bump portion 151 becomes low, bonding with the substrate may be impossible or bonding reliability may deteriorate.

Referring to FIG. 17B, in the case where a bump pillar 140 is formed into a quadrangular prism shape, an amount of solder remaining on the bump pillar 140 after a reflow process may be increased and thus the height of a solder bump portion 151 may be increased, when compared to the case of forming the bump pillar 140 into the cylindrical shape. In the present embodiments, by forming the bump pillar 140 into a quadrangular prism shape, the height of the solder bump portion 151 may be sufficiently secured.

Figure 18:
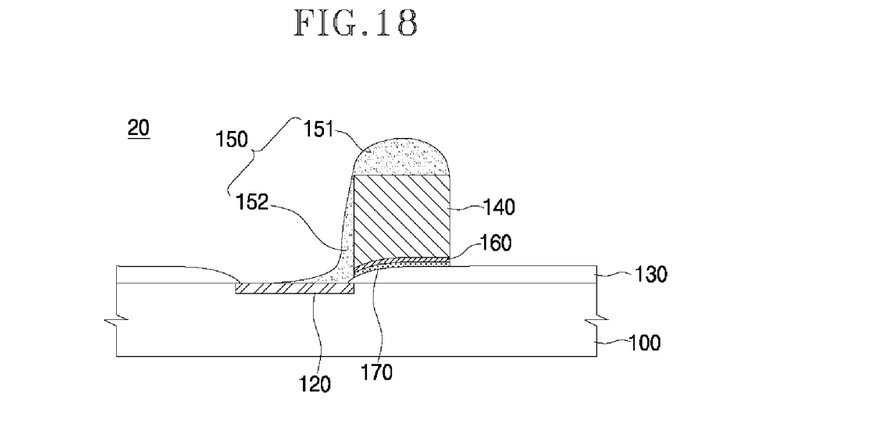
FIG. 18 is a cross-sectional view illustrating a representation of an example part of a semiconductor device in accordance with an embodiment.

FIG. 18 is a cross-sectional view illustrating a representation of an example of a part of a semiconductor device 20 in accordance with an embodiment.

In the embodiment to be described below with reference to FIG. 18, the same technical terms and the same reference numerals will be used to refer to substantially the same components as the components of the embodiment described above with reference to FIGS. 1 and 2, and repeated descriptions will be omitted herein.

Referring to FIG. 18, a bump pillar 140 may be disposed over a passivation layer 130 adjacent to a pad 120. The bump pillar 140 overlaps with the passivation layer 130, but does not overlap with the pad 120.

A seed layer 160 may be interposed between the bump pillar 140 and the passivation layer 130. A barrier layer 170 may be interposed between the seed layer 160 and the passivation layer 130. The seed layer 160 and the barrier layer 170 may only be formed under the bump pillar 140, and may not be formed over the top surface of the pad 120. That is to say, the pad 120 may not be covered by the seed layer 160 or the barrier layer 170.

A solder layer 150 may be formed over the bump pillar 140 and the pad 120. The solder layer 150 may include a solder bump portion 151 and a solder fillet portion 152.

The solder bump portion 151 may be disposed on the top surface of the bump pillar 140, and may be a hemispherical or a portion of a sphere having a predetermined curvature in cross-section. The solder fillet portion 152 may be formed on one side of the bump pillar 140 facing the pad 120 to partially cover the top surface of the pad 120. The solder fillet portion 152 may be brought into direct contact with the bump pillar 140 and the pad 120, and thereby electrically couple the bump pillar 140 and the pad 120.

Effects achieved by the above-described embodiments are as follows.

As described above, a probe mark may be formed on the top surface of a pad in a test process. The probe mark indicates a dent and/or an overhang caused due to the surface layer of the pad that is pushed or distorted by a probe tip. A probe mark D is illustrated in FIG. 19.

Figure 19:
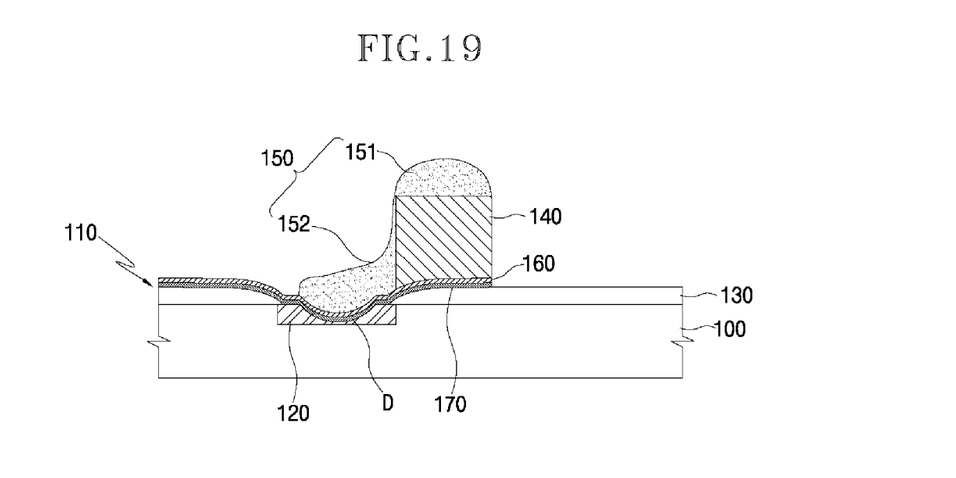
FIG. 19 is a view illustrating a representation of an example of a situation where a probe mark is formed on a pad of the semiconductor device in accordance with an embodiment.

According to the present embodiments, as illustrated in FIG. 19, a solder which forms a solder fillet portion 152 may be melted to a liquid state during a reflow process, and fill the probe mark D which exists on the surface of the pad 120. Therefore, because the contact area between the pad 120 and the solder fillet portion 152 is increased, the coupling force between the pad 120 and the solder fillet portion 152 may be improved.

In order to reduce the size of a semiconductor chip, a circuit unit is disposed to overlap with a pad. However, in this structure, the pad and its underlying structure may become substantially invulnerable to a stress, and thus, a defect may occur in that the pad likely to be lifted when a stress is applied. If heat is applied during a process of reflowing solder to mount a semiconductor chip to a substrate, a molding process for protecting the semiconductor chip from external circumstances, a reliability test process, etc., the semiconductor chip and the substrate may warp due to a difference in a thermal expansion coefficient between the semiconductor chip and the substrate. According to the present embodiments, because a bump is not positioned on the pad and is positioned on a passivation layer, it is possible to prevent stress induced as the semiconductor chip and the substrate warp, from being directly applied to the pad through a bump pillar. Therefore, it is possible to suppress a pad lifting phenomenon due to stress, and further, it is possible to prevent the poor coupling between the semiconductor chip and the substrate due to lifting of the pad.

A solder bump portion plays the role of bonding the bump pillar and the substrate. In order for stable coupling with the substrate, the height of the solder bump portion should be secured to be higher than or equal to a predetermined height. According to the present embodiments, because a solder fillet portion is formed to not cover the entirety of the top surface of the pad and cover only a portion of the top surface of the pad, when compared to a case where a solder fillet portion covers the entirety of the top surface of a pad, an amount of solder flowing downward from the top surface of the bump pillar during the reflow process may be decreased. Thus, because it is possible to cause a larger amount of solder to remain on the top of the bump pillar and thus sufficiently secure the height of the solder bump portion, it is possible to prevent a poor solder junction.

The above-described semiconductor devices may be applied to various package modules.

Figure 20:
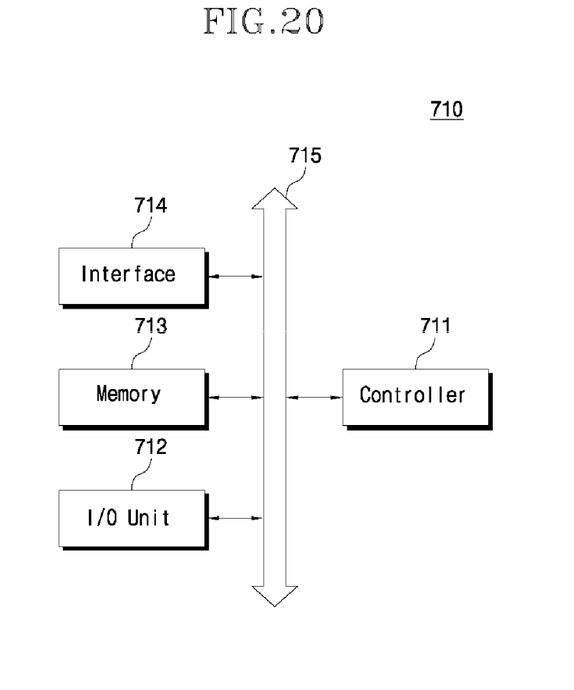
FIG. 20 is a block diagram illustrating a representation of an example electronic system which includes the semiconductor device in accordance with an embodiment.

Referring to FIG. 20, the semiconductor devices in accordance with the present embodiments may be applied to an electronic system 710. The electronic system 710 may include a controller 711, an input/output 712, and a memory 713. The controller 711, the input/output 712, and the memory 713 may be coupled to each other through a bus 715 to provide a path through which data are transmitted.

For example, the controller 711 may include one or more microprocessors, one or more digital signal processors, one or more microcontrollers, and one or more logic circuits capable of performing the same functions as the components. The memory 713 may include one or more of the semiconductor devices in accordance with the present embodiments. The input/output 712 may include one or more selected from a keypad, a keyboard, a display device, and a touch screen. The memory 713 may store data and/or a command executed by the controller 711 or the like.

The memory 713 may include a volatile memory device such as a DRAM and/or a nonvolatile memory device such as a flash memory. For example, the flash memory may be mounted in an information processing system such as a mobile terminal or desktop computer. The flash memory may be implemented as an SSD (Solid State Disk). In this case, the electronic system 710 may stably store a large amount of data in the flash memory system.

The electronic system 710 may further include an interface 714 configured to transmit/receive data to/from a communication network. The interface 714 may include a wired or wireless interface. For example, the interface 714 may include an antenna, a wired transceiver, or a wireless transceiver.

The electronic system 710 may be a mobile system, a personal computer, an industrial computer, or a logic system which performs various functions. For example, the mobile system may correspond to any one of a PDA (Personal Digital Assistant), a portable computer, a tablet computer, a mobile phone, a smart phone, a wireless telephone, a laptop computer, a memory card, a digital music system, and an information transmitting/receiving system.

When the electronic system 710 performs wireless communications, the electronic system 710 may be used in a communication system such as CDMA (Code Division Multiple Access), GSM (Global System for Mobile communication), NADC (North American Digital Cellular), E-TDMA (Enhanced-Time Division Multiple Access), WCDMA (Wideband Code Division Multiple Access), CDMA2000, LTE (Long Term Evolution), or Wibro (Wireless Broadband Internet).

Figure 21:
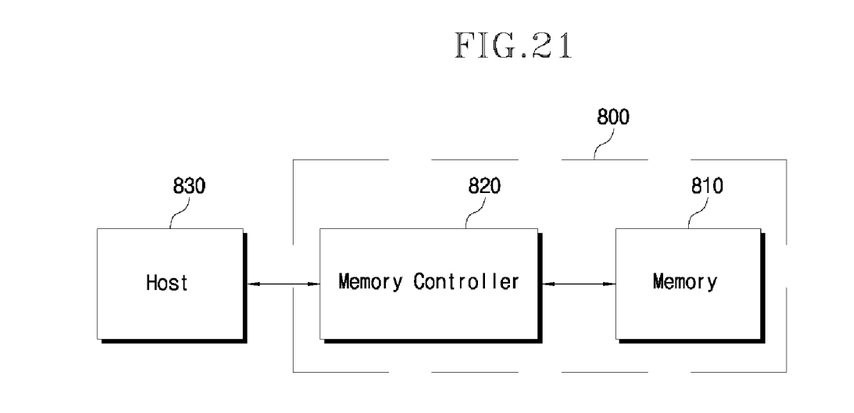
FIG. 21 is a block diagram illustrating a representation of an example memory card which includes the semiconductor device in accordance with an embodiment.

Referring to FIG. 21, the semiconductor devices in accordance with the present embodiments may be provided in the form of a memory card 800. For example, the memory card 800 may include a memory 810 such as a nonvolatile memory device and a memory controller 820. The memory 810 and the memory controller 820 may store data or read stored data.

The memory 810 may include one or more nonvolatile memory devices to which the semiconductor devices in accordance with the present embodiments are applied, and the memory controller 820 may control the memory 810 to read data stored therein or to store data therein in response to a write/read request from a host 830.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a semiconductor chip having a pad which is exposed through a passivation layer;
   a bump pillar formed over the passivation layer adjacent to the pad, but not overlapping with the pad; and
   a solder layer including a solder bump portion which is formed over the bump pillar and a solder fillet portion which is formed at one side of the bump pillar facing the pad to cover the pad and electrically couples the bump pillar and the pad.

2. The semiconductor device according to claim 1, further comprising:
   a seed layer interposed between the passivation layer and the bump pillar and between the pad and the solder fillet portion.

3. The semiconductor device according to claim 2, further comprising:
   a barrier layer interposed between the passivation layer and the seed layer and between the pad and the seed layer.

4. The semiconductor device according to claim 1, further comprising:
   a seed layer interposed between the passivation layer and the bump pillar.

5. The semiconductor device according to claim 4, further comprising:
   a barrier layer interposed between the seed layer and the passivation layer.

6. The semiconductor device according to claim 4, wherein the seed layer comprises the same material as the bump pillar.

7. The semiconductor device according to claim 6, wherein the seed layer and the bump pillar comprise at least any one among copper, nickel, gold, silver, platinum and alloys thereof.

8. The semiconductor device according to claim 1, wherein the solder fillet portion is formed to cover a portion of a top surface of the pad adjacent to the bump pillar and leave a remaining portion of the top surface of the pad exposed.

9. The semiconductor device according to claim 8, wherein the solder fillet portion is formed to cover one edge portion of the pad adjacent to the bump pillar and a center portion of the pad and leave remaining edge portions of the pad which define the shape of a clockwise 90-degree rotated U exposed.

10. The semiconductor device according to claim 1, wherein the bump pillar has a quadrangular prism shape.

11. The semiconductor device according to claim 1,
    wherein the bump pillar is disposed adjacent to the pad in a first direction,
    wherein the first direction and a second direction are directions that are perpendicular to each other, and
    wherein a width of the solder fillet portion in the second direction is narrower than a width of the pad in the second direction.

12. A semiconductor device comprising:
    a semiconductor chip having a plurality of pads which are disposed in line along a second direction perpendicular to a first direction and a passivation layer which leaves the pads exposed;
    a plurality of bump pillars formed over the passivation layer, corresponding to the pads, respectively, and disposed to be separated from corresponding pads, respectively, in the first direction; and
    a plurality of solder layers formed over corresponding pads and corresponding bump pillars, respectively,
    wherein each of the solder layers includes a solder bump portion which is formed over a corresponding bump pillar and a solder fillet portion which is formed at one side of the bump pillar facing a corresponding pad to cover the pad and electrically couples the bump pillar and the pad.

13. The semiconductor device according to claim 12, wherein the bump pillars are disposed to have the same pitch as the pads, and a width of each of the bump pillars in the second direction is less than a width of each of the pads in the second direction.

14. The semiconductor device according to claim 12, wherein each of the solder layers has a linear type planar structure which extends in the first direction to continuously cover a corresponding pad and a corresponding bump pillar.

15. The semiconductor device according to claim 14, wherein the solder layers are disposed to have the same pitch as the pads, and a width of each of the solder layers in the second direction is less than a width of each of the pads in the second direction.

16. The semiconductor device according to claim 15, wherein a spacing in the second direction between solder fillet portions of adjacent solder layers among the solder layers is wider than a spacing in the second direction between adjacent pads.

17. A method for manufacturing a semiconductor device, comprising:
    preparing a semiconductor chip having a pad which is exposed through a passivation layer;
    forming a bump pillar over the passivation layer adjacent to the pad to not overlap with the pad;
    forming a solder layer over the bump pillar and the pad; and
    reflowing the solder layer, thereby forming a solder bump portion over the bump pillar and forming a solder fillet portion at one side of the bump pillar facing the pad to cover the pad and electrically couple the bump pillar and the pad.

18. The method according to claim 17, further comprising:
    forming a seed layer over the passivation layer and the pad, before forming of the bump pillar; and
    removing the seed layer by using the solder layer as a mask, after forming the solder layer and before reflowing the solder layer.

19. The method according to claim 18, further comprising:
    forming a barrier layer over the passivation layer and the pad, before forming the seed layer; and
    removing the barrier layer by using the solder layer as a mask, after removing the seed layer.

20. The method according to claim 18, wherein forming the bump pillar comprises:
    forming a first mask pattern which covers the seed layer over the pad and has a first opening which leaves the seed layer exposed over the passivation layer adjacent to the pad;
    performing a plating process such that the bump pillar is formed in the first opening; and
    removing the first mask pattern.

21. The method according to claim 20,
    wherein the first opening is formed adjacent to the pad in a first direction,
    wherein the first direction and a second direction are directions that are perpendicular to each other, and
    wherein a width of the first opening in the second direction is narrower than a width of the pad in the second direction.

22. The method according to claim 21, wherein forming the solder layer comprises:
    forming over the seed layer a second mask pattern which has a second opening leaves exposed the bump pillar and the seed layer over the pad;
    performing a plating process such that the solder layer is formed over the bump pillar and the seed layer both of which the second opening leaves exposed; and
    removing the second mask pattern.

23. The method according to claim 22, wherein a width of the second opening in the second direction is narrower than a width of the pad in the second direction.

* * * * *